US007750684B2

(12) United States Patent
Jurasek et al.

(10) Patent No.: US 7,750,684 B2
(45) Date of Patent: Jul. 6, 2010

(54) POWER-ON DETECTION CIRCUIT FOR DETECTING MINIMUM OPERATIONAL FREQUENCY

(75) Inventors: Ryan Andrew Jurasek, S. Burlington, VT (US); Bret Roberts Dale, Jericho, VT (US); Darin James Daudelin, Williston, VT (US); Dave Eugene Chapmen, Shelburne, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/105,280

(22) Filed: Apr. 18, 2008

(65) Prior Publication Data

US 2009/0261870 A1 Oct. 22, 2009

(51) Int. Cl.
*G01R 23/02* (2006.01)
*H03D 3/00* (2006.01)
*H03K 9/06* (2006.01)

(52) U.S. Cl. .......................... 327/47; 327/143; 327/198

(58) Field of Classification Search ................ 327/142, 327/143, 333, 198
See application file for complete search history.

(56) References Cited

U.S. PATENT DOCUMENTS 5,446,403 A * 8/1995 Witkowski .................. 327/143
5,933,036 A * 8/1999 Kim ........................... 327/143
6,417,704 B1 * 7/2002 Nakajima et al. ........... 327/143
6,946,886 B2 * 9/2005 Isomura ...................... 327/141
6,993,315 B1 * 1/2006 Frazier ....................... 455/334
7,015,732 B1 * 3/2006 Holloway et al. ........... 327/143
7,057,427 B2 * 6/2006 Wadhwa et al. ............. 327/143
7,081,780 B2 * 7/2006 Briggs et al. ................ 327/143
7,184,798 B1 * 2/2007 Brown et al. ................ 455/574
7,196,561 B2 * 3/2007 Bhattacharya et al. ...... 327/143
7,518,419 B1 * 4/2009 Pasqualini .................. 327/143
2002/0052186 A1 * 5/2002 Deas et al. ............... 455/226.1
2007/0046369 A1 * 3/2007 Schober et al. ................ 330/7
2009/0156158 A1 * 6/2009 Kang et al. ................. 455/336
2009/0167093 A1 * 7/2009 Nguyen et al. ................ 307/80

* cited by examiner

*Primary Examiner*—Lincoln Donovan
*Assistant Examiner*—Adam D Houston
(74) *Attorney, Agent, or Firm*—Winston Hsu

(57) ABSTRACT

A power-on detection circuit for detecting a minimum operational frequency includes: an oscillating circuit, which includes: a ring oscillator, for generating a first oscillating signal; and a high pass filter for filtering the first oscillating signal to generate a second oscillating signal. The power-on detection circuit also includes a rectification device, coupled to the high pass filter, for generating a logic signal once the second oscillating signal reaches a certain frequency.

4 Claims, 3 Drawing Sheets

POWER-ON DETECTION CIRCUIT FOR DETECTING MINIMUM OPERATIONAL FREQUENCY

BACKGROUND OF THE INVENTION

1. Field of the Invention

The present invention relates to power-on detection circuits, and more particularly to power-on detection circuits for detecting a minimum operational frequency required to power-on a device.

2. Description of the Prior Art

Most circuits require certain minimum power levels for operation. It is therefore necessary to have some form of power detection circuit that can detect when this power level is reached, thereby determining that power-on is possible. If the power level detected is too low then the circuit will be unable to operate. If the power level detected is too high then some potential operational time, energy, and potential for lower voltage operation will have been wasted.

Please refer to FIG. 1. FIG. 1 is a diagram of a conventional power detection circuit 100. The circuit 100 comprises a first resistor R1 (12) coupled to a voltage supply, a second resistor R2 (14) coupled between R1 and ground, and a transistor 16 where the gate of the transistor 16 is coupled between R1 and R2. The source of the transistor 16 is coupled to a third resistor R3 (18) and an output device 20 and the drain of the transistor 16 is coupled to ground. The circuit 100 works by utilizing a ratio of the first resistance to the second resistance (R1/R2). When the ratio is above a certain voltage Vt it will power-on the transistor 16, causing the transistor 16 to pull down against the resistor R3, thereby generating a signal in the output device 20 that signifies that power is sufficient for power-on.

As the circuit 100 utilizes a ratio of two resistors, the level at which it is determined that power-on is possible is not as precise as desired. It is the aim of the present invention to provide a circuit and a method of power detection that can determine a minimum power required for power-on with a high level of accuracy.

SUMMARY OF THE INVENTION

With this in mind, it is an objective of the present invention to provide a system and method for detecting a minimum operational frequency to determine when power-on is possible.

A power-on detection circuit for detecting a minimum operational frequency comprises: an oscillating circuit, for generating an oscillating signal having an upper threshold; and a rectification device, coupled to the oscillating circuit, for generating a logic signal once the oscillating signal reaches a certain frequency. The oscillating circuit comprises: a ring oscillator, for generating a first oscillating signal up to the upper threshold; and a high pass filter, coupled to the ring oscillator, for filtering the first oscillating signal to generate a second oscillating signal to the rectification device, wherein the logic signal is generated once the first oscillating signal reaches a certain frequency. The rectification device comprises: a transistor, having a gate coupled to the high pass filter and a source coupled to ground; a resistor, coupled between a second reference voltage and a drain of the transistor; a capacitor, coupled between the resistor and the drain of the transistor, for storing charges when the second oscillating signal is not input to the rectification device and for discharging when the transistor is turned on by the second oscillating signal; and a logic detect circuit, coupled to the capacitor, for outputting the logic signal when the capacitor discharges.

A method of detecting a minimum operational frequency comprises: generating an oscillating signal having an upper threshold; and generating a logic signal once the oscillating signal reaches a certain frequency. The step of generating an oscillating signal having an upper threshold comprises: generating a first oscillating signal up to the upper threshold; and filtering the first oscillating signal to generate a second oscillating signal; and the step of generating the logic signal comprises: generating the logic signal once the first oscillating signal reaches a certain frequency. The step of generating a logic signal once the first oscillating signal reaches a certain frequency comprises: providing a transistor that is turned on at the certain frequency; providing a capacitor; storing charges in the capacitor when the first oscillating signal is below the certain frequency; discharging the capacitor when the transistor is turned on by the first oscillating signal; and outputting the logic signal when the capacitor discharges.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a circuit that utilizes a frequency as a means of detecting when power-on of a device is possible. The use of frequency enables a power-on threshold to be determined with higher accuracy than in related art methods.

Figure 1:
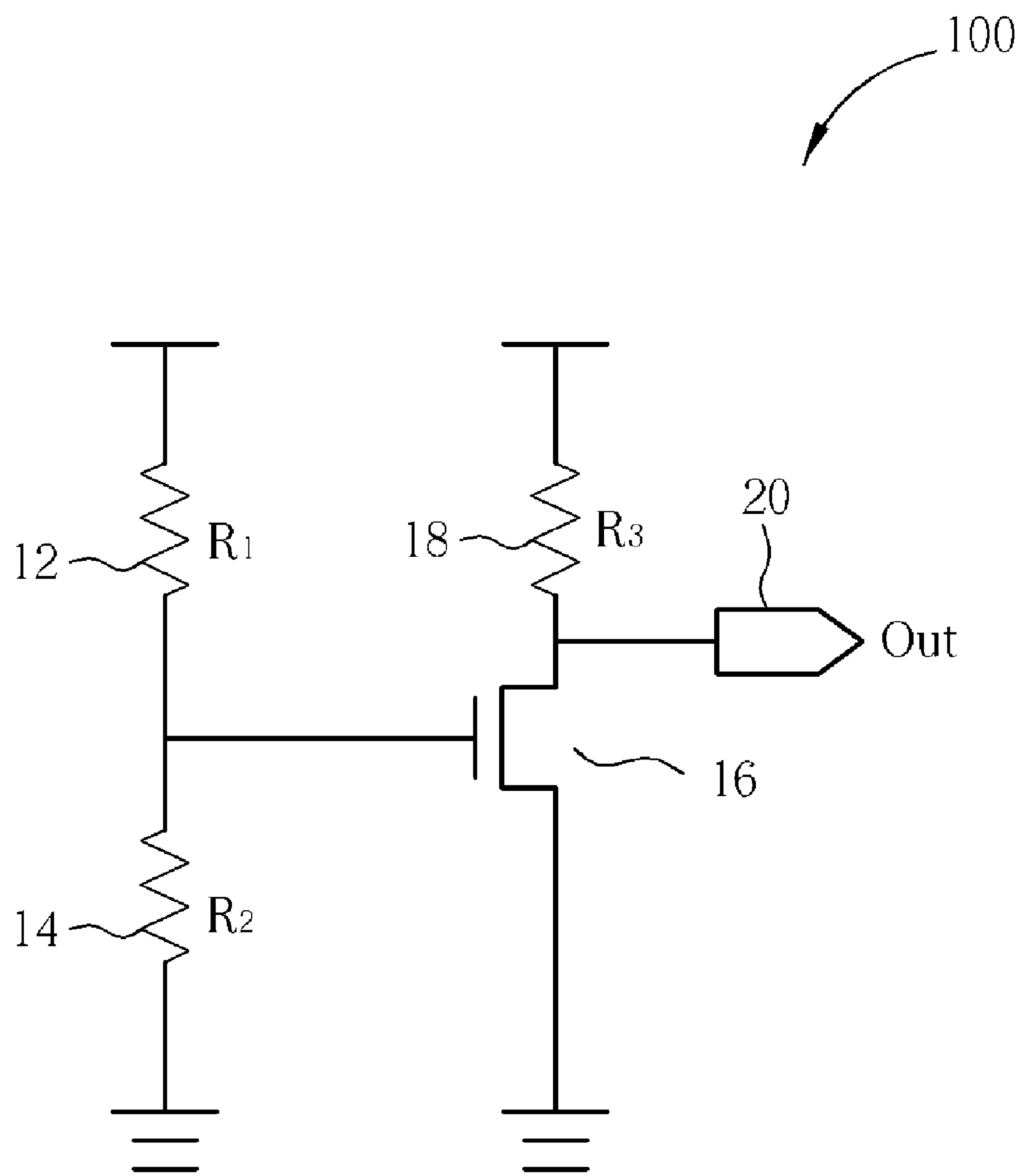
FIG. 1 is a diagram of a prior art power-on detection circuit.
Figure 2:
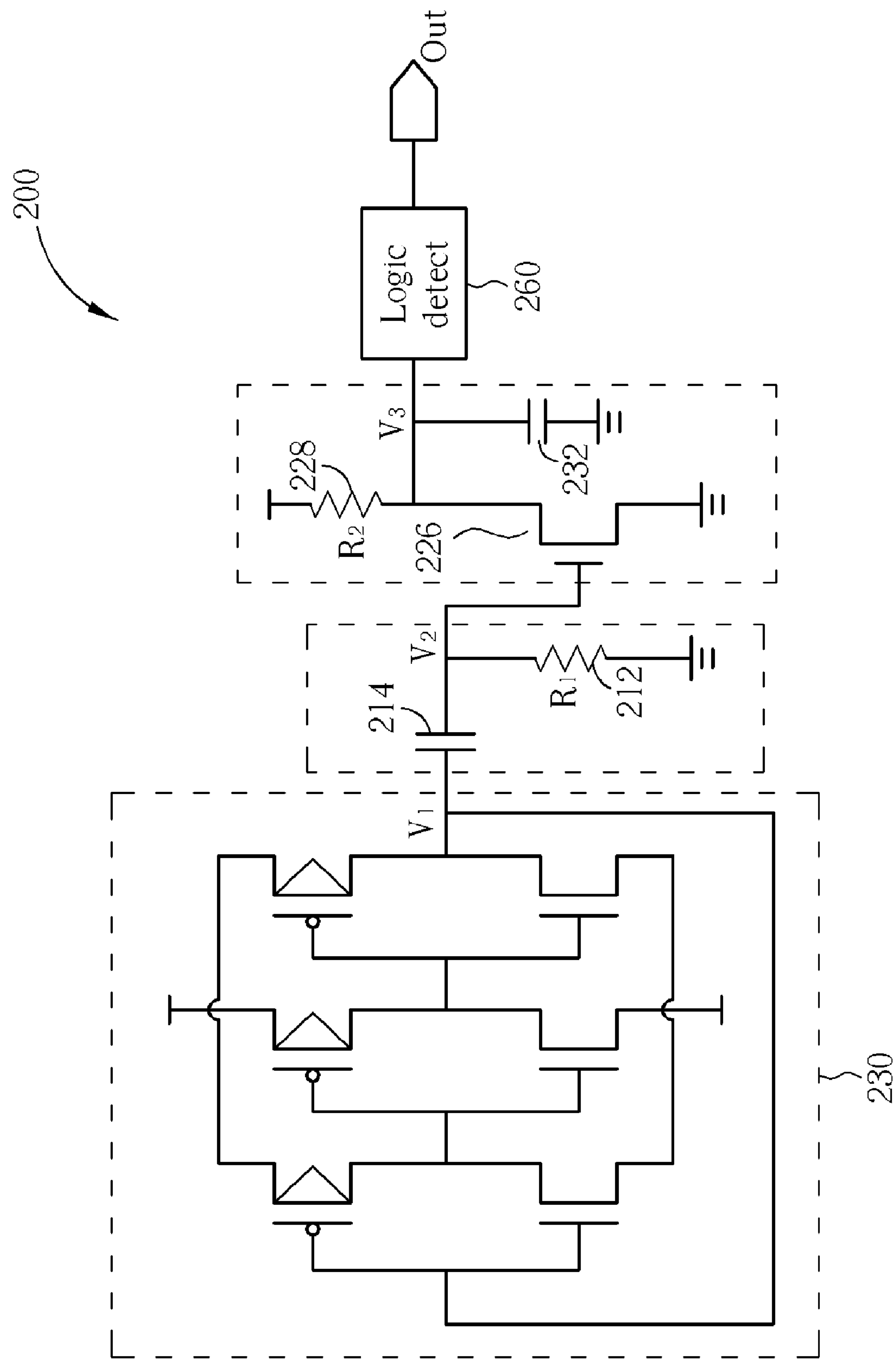
FIG. 2 is a diagram of a power-on detection circuit according to an exemplary embodiment of the present invention.

Please refer to FIG. 2. FIG. 2 is a diagram of a power-on detection circuit according to an exemplary embodiment of the present invention. The circuit 200 comprises three stages, as shown by the boxes in dashed lines, which are annotated as V1, V2 and V3. At each stage, a signal is generated, and the logic detect 260 outputs a logic signal when it is determined that power-on is possible according to the frequency of the signal.

The circuit 200 comprises a ring oscillator 230, coupled to a high pass RC filter consisting of capacitor 214 and resistor R1 (212). The high pass filter is coupled to a rectification device consisting of a transistor 226, a resistor R2 (228) and a capacitor 232 coupled between the drain of the transistor 226 and ground. The rectification device is coupled to the logic detect 260 for generating a logic signal when a frequency is sufficient to allow power-on.

Initially, the ring oscillator 230 generates an oscillating signal causing a first oscillating signal at V1 above a certain frequency. This first oscillating signal is then filtered by the high pass filter, causing a filtered oscillating signal (a second oscillating signal) to appear at V2. The second oscillating signal is fed into the rectification device. This signal initially has a frequency and amplitude too low to turn on the transistor 226, so it causes the capacitor 232 to store charges. A signal corresponding to the stored charge of the capacitor 232 is therefore present at V3. With an increase in frequency of the first oscillating signal generated by the ring oscillator 230

(and subsequently filtered by the high pass filter), the signal at V3 will increase, until a certain saturation point is reached. This saturation point corresponds to the second oscillating signal turning on the transistor 226. At this point, the transistor 226 will cause the capacitor 232 to discharge, and the signal at V3 will therefore be pulled down faster than the resistor R2 can pull it up. The logic detect circuit 260 detects this change and outputs a logic signal indicating that the minimum frequency for power-on has been reached.

Figure 3:
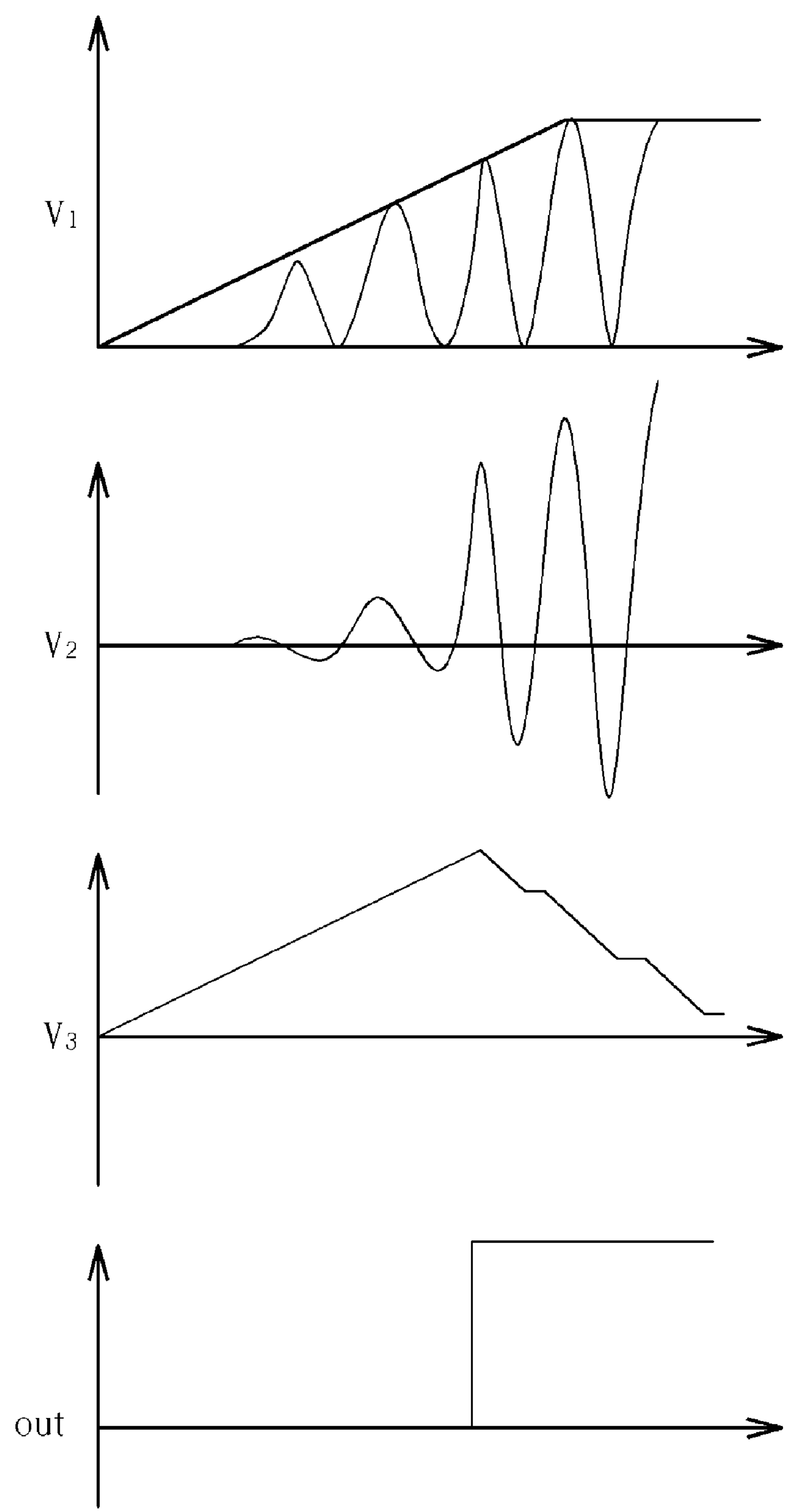
FIG. 3 is a diagram showing the operation of all stages in the power-on detection circuit shown in FIG. 2.

For a clearer illustration of the stages of the circuit 200, please refer to FIG. 3, which shows the output signals at stages V1, V2, V3 and the output of the logic detect 260. The ring oscillator starts to oscillate above a certain frequency, as shown in the graph of V1. The oscillations increase until the supply ramp is reached, at which point the oscillation frequency levels off.

At V2, because the signal is high pass filtered, the oscillating signal will only be passed at a certain frequency and amplitude. One advantage of the circuit 200 shown in FIG. 2 is that the high pass filter can be set precisely to only allow oscillating signals above a desired amplitude and frequency to be passed.

As can be seen in the V2 graph, the signal only goes high above a certain frequency and amplitude. Up to this point, the voltage at V3 has been steadily increasing. Once the signal at V2 starts to oscillate properly, however, the transistor 226 becomes operational, and the resistor R2 is unable to pull up the signal before the transistor 226 can pull it down. Therefore, there is a sudden drop in the voltage at V3.

The drop in the voltage at V3 is detected by the logic detect 260, which outputs a logic signal. This logic signal indicates that the power is sufficient for operations to commence.

Please note that the illustration of the rectification device in FIG. 2 is not a limitation of the present invention. Those skilled in the art will be able to see that the transistor 226 can be implemented by an NMOS or by a PMOS. The rectification device can also include a buffer (not shown).

The utilization of the ring oscillator ensures that the logic signal will be output at a certain frequency, as ring oscillators have a certain set frequency. The utilization of the high pass filter ensures a clear division between a point at which the transistor is not operational, and a point at which the transistor 226 is operational and can discharge the capacitor 232.

The power-on detection circuit therefore provides a system and method for precisely determining a power-on threshold.

Those skilled in the art will readily observe that numerous modifications and alterations of the device and method may be made while retaining the teachings of the invention.

What is claimed is:

1. A power-on detection circuit for detecting a minimum operational frequency, comprising:

an oscillating circuit, for generating an oscillating signal having an upper threshold, comprising;

a ring oscillator, for generating a first oscillating signal up to the upper threshold; and a high pass filter, coupled to the ring oscillator, for filtering the first oscillating signal to generate a second oscillating signal, wherein a logic signal is generated once the first oscillating signal reaches the certain frequency; and a rectification device, coupled to the oscillating circuit, for receiving the second oscillating signal and generating the logic signal once the first oscillating signal reaches a certain frequency, comprising:

a transistor, having a gate coupled to the high pass filter and a source coupled to a first reference voltage;

a resistor, coupled between a second reference voltage and a drain of the transistor; and a logic detect circuit, coupled to the drain of the transistor, for outputting the logic signal when the transistor is turned on by the second oscillating signal.

2. The power-on detection circuit of claim 1, wherein the second oscillating signal is generated at a predetermined frequency and amplitude of the first oscillating signal, and the logic signal is generated after the second oscillating signal is generated.

3. A power-on detection circuit for detecting a minimum operational frequency, comprising:

an oscillating circuit, for generating an oscillating signal having an upper threshold; and a rectification device, coupled to the oscillating circuit, for receiving the oscillating signal and generating a logic signal once the oscillating signal reaches a certain frequency, comprising:

a transistor that is turned on at the certain frequency, having a gate coupled to the oscillating device and a source coupled to a first reference voltage;

a resistor, coupled between a second reference voltage and a drain of the transistor;

a capacitor, coupled between the resistor and the drain of the transistor, for storing charges when the oscillating signal is below the certain frequency and for discharging when the transistor is turned on by the oscillating signal; and a logic detect circuit, coupled to the capacitor, for outputting the logic signal when the capacitor discharges.

4. The power-on detection circuit of claim 3, wherein the second oscillating signal is generated at a predetermined frequency and amplitude of the first oscillating signal, and the logic signal is generated after the second oscillating signal is generated.

* * * * *